(12) United States Patent
Tseng et al.

(10) Patent No.: US 11,084,715 B2
(45) Date of Patent: Aug. 10, 2021

(54) SEGMENTED PEDESTAL FOR MOUNTING DEVICE ON CHIP

(71) Applicant: Taiwan Semiconductor Manufacturing Co., Ltd., Hsin-Chu (TW)

(72) Inventors: Lee-Chuan Tseng, New Taipei (TW); Yuan-Chih Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/419,314

(22) Filed: May 22, 2019

(65) Prior Publication Data

US 2020/0369515 A1  Nov. 26, 2020

(51) Int. Cl.
*B81B 7/02* (2006.01)
*B81C 1/00* (2006.01)

(52) U.S. Cl.
CPC ............ *B81B 7/02* (2013.01); *B81C 1/00047* (2013.01); *B81C 1/00063* (2013.01); *B81C 1/00428* (2013.01); *B81C 1/00531* (2013.01); *B81B 2203/033* (2013.01); *B81B 2203/0315* (2013.01); *B81C 2203/038* (2013.01)

(58) Field of Classification Search
CPC .............. B81B 7/02; B81B 2203/0315; B81C 1/00047; B81C 1/00428; B81C 1/00063; B81C 1/00531
See application file for complete search history.

(56) References Cited

U.S. PATENT DOCUMENTS

| | | | |
|---|---|---|---|
| 9,695,039 B1* | 7/2017 | Liu | B81B 3/0051 |
| 10,290,611 B2 | 5/2019 | Yu et al. | |
| 10,343,895 B2 | 7/2019 | Chang et al. | |
| 10,629,468 B2 | 4/2020 | Yota et al. | |
| 2007/0114643 A1* | 5/2007 | DCamp | B81B 7/0077 |
| | | | 257/678 |
| 2007/0254411 A1* | 11/2007 | Uhland | H01L 23/5389 |
| | | | 438/127 |
| 2008/0283943 A1* | 11/2008 | Dekker | B81C 1/00293 |
| | | | 257/415 |
| 2014/0092935 A1* | 4/2014 | Lin | G01N 25/4893 |
| | | | 374/10 |
| 2015/0091153 A1* | 4/2015 | Liu | B81C 1/00293 |
| | | | 257/704 |
| 2015/0137280 A1* | 5/2015 | Chu | B81B 7/02 |
| | | | 257/415 |

(Continued)

*Primary Examiner* — Nathan W Ha
(74) *Attorney, Agent, or Firm* — Eschweiler & Potashnik, LLC

(57) ABSTRACT

A system includes a semiconductor substrate having a first cavity. The semiconductor substrate forms a pedestal adjacent the first cavity. A device overlays the pedestal and is bonded to the semiconductor substrate by metal within the first cavity. A plurality of second cavities are formed in a surface of the pedestal beneath the device, wherein the second cavities are smaller than the first cavity. In some of these teachings, the second cavities are voids. In some of these teachings, the metal in the first cavity comprises a eutectic mixture. The structure relates to a method of manufacturing in which a layer providing a mask to etch the first cavity is segmented to enable easy removal of the mask-providing layer from the area over the pedestal.

20 Claims, 5 Drawing Sheets

(56) References Cited

U.S. PATENT DOCUMENTS

| | | | |
|---|---|---|---|
| 2015/0175406 A1* | 6/2015 | Lin | B81B 7/007 |
| | | | 257/415 |
| 2017/0210617 A1* | 7/2017 | Sadaka | B81C 1/00047 |
| 2018/0346321 A1* | 12/2018 | Takubo | B81B 7/02 |

* cited by examiner

SEGMENTED PEDESTAL FOR MOUNTING DEVICE ON CHIP

BACKGROUND

For many instances of semiconductor manufacturing, and particularly in the manufacture of micro-electromechanical systems (MEMS), it is desirable to bond a separately manufactured device to a semiconductor substrate. MEMS are used in a wide range of applications. For example, MEMS are found in hand held devices (e.g., accelerometers, gyroscopes, digital compasses), pressure sensors (e.g., crash sensors), micro-fluidic elements (e.g., valves, pumps), optical switches (e.g., mirrors), and light detection and ranging (LiDAR).

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

DETAILED DESCRIPTION

Figure 1:
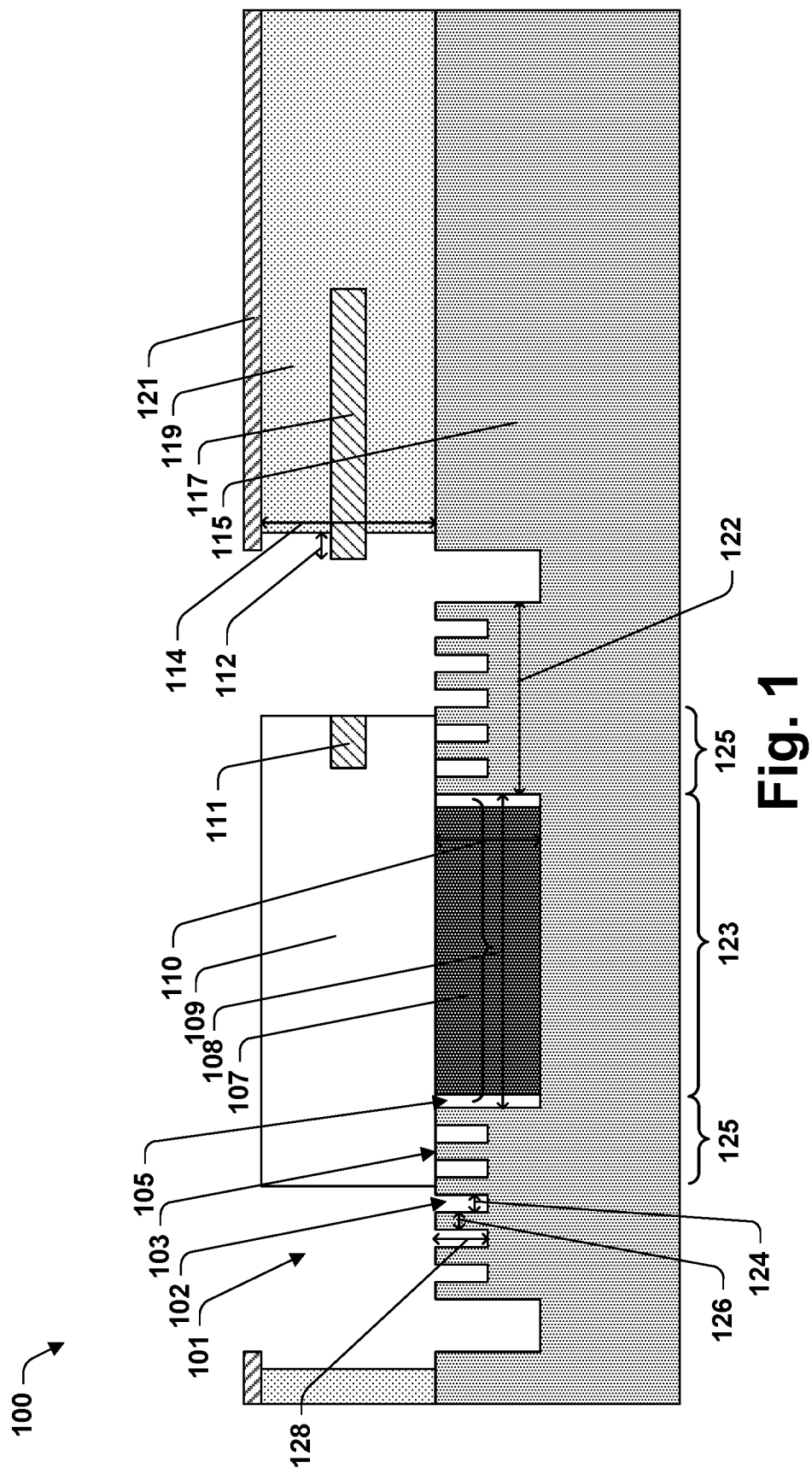
FIG. 1 illustrates a cross-sectional view of a micro-electromechanical system (MEMS), according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

The present disclosure relates to a microelectromechanical system (MEMS) that include a device attached to a semiconductor substrate using a bonding process such as compression bonding, solid-liquid inter-diffusion bonding (SLiD), or the like. The device and the substrate may be placed together in a lock and key arrangement, with a cavity on the substrate providing the lock and a metal bump on the device providing the key. The device may be made to rest on a pedestal formed by the substrate adjacent the cavity.

In accordance with some aspects of the present teachings, the pedestal is scored with closely spaced openings. These openings reflect openings formed in a layer used as a mask when etching the cavity in the substrate. The openings reduce an etch-process related critical dimension of the mask-providing layer at locations where the mask-providing layer overlays the pedestal. Reducing the critical dimension of the mask-providing layer at those locations enables removal of the mask-providing layer from the pedestal area with an abbreviated etch process. Abbreviating the etch process used to remove the mask-providing layer from the pedestals may avoid damage to other structures that could otherwise occur incidentally during the removal process.

As used in the present disclosure, an etch-process related critical dimension characterizes an etching time in the approximation that the time it takes to remove a structure by etching is proportional to a maximum depth of any part of that structure from the closest exposed surface. The critical dimension of a cube would be one half a side length. The critical dimension of a sphere would be its radius. The critical dimension of a solid film with only one side exposed would be the thickness of the film. The critical dimension of a solid film may be reduced by patterning the film with a pattern having a critical dimension less than the film thickness. For example, if the film is segmented with periodically spaced trenches having a trench-to-trench spacing that is less than the film thickness, the critical dimension is reduced to half the trench-to-trench spacing.

Some aspects of the present teaching relate to a method of bonding a second device to a substrate on which is formed a first device. In some of these teaching, the first device is formed within a dielectric matrix on the substrate. The dielectric matrix may be an oxide. The process includes forming a mask over the dielectric matrix wherein the mask includes an opening for forming a cavity and a plurality of smaller opening in a pedestal area adjacent the cavity opening. The mask is used to etch a corresponding pattern in the dielectric matrix. Then, etching through the patterned dielectric matrix, a cavity is formed in the substrate. The smaller openings may result in the pedestals adjacent the cavity having scored surfaces. The dielectric matrix is removed from the pedestal area after forming the cavity. The smaller openings reduce the time required for this stage of processing by reducing the critical dimension of that portion of the dielectric matrix that is to be removed. The reduced processing time relates to a reduction in lateral etching of the dielectric matrix adjacent the pedestal area, which can improve the functionality of the resulting device. In some embodiments the first device is a waveguide that extends from the dielectric matrix into the opening in the dielectric matrix that is formed over the pedestal area. Reducing the lateral etching may reduce the overhang of that waveguide within that opening, which in turn may facilitate maintaining proper orientation of the waveguide.

The second device may be bonded to the substrate after removing the dielectric matrix from the pedestal area. In some of these teaching, the second device includes a metal bump that is inserted into the cavity when the second device is placed on the substrate. In some of these teachings, the metal is made to diffuse or flow while biasing the second device against the substrate. Before the bonding processes is completed, the second device will come to rest against the pedestal, whereby the vertical alignment of the second device with the first device is determined by the pedestal height. In some of these teachings, the second device is a laser, the first device is a waveguide, and the vertical positioning aligns the laser to the waveguide. In the resulting structure, the second device is bound to the substrate by a metal bonding structure that is contained within the cavity. In some of these teachings, the bonding process includes SLiD bonding.

FIG. 1 illustrates a MEMS 100 according to some aspects of the present teachings. MEMS 100 includes a substrate 115. A dielectric matrix 119 is formed over substrate 115. A waveguide 117 or other device may be formed within dielectric matrix 119. A second device, device 109, is bonded to semiconductor substrate 115 within an opening 101 in dielectric matrix 119. Device 109 is bonded to substrate 115 by a metal bonding structure 107 within a cavity 105 that has been formed in substrate 115 within a bonding area 123. In some of these teachings, device 109 is a laser. In some of these teachings metal bonding structure 107 includes a eutectic mixture of two metals.

Device 109 abuts pedestals 103 within a support area 125 of substrate 115 that is adjacent bonding area 123. Pedestals 103 are areas of substrate 115 that are adjacent cavity 105. With device 109 resting on pedestals 103, an output device 111 of device 109 is aligned with waveguide 117. Waveguide 117 protrudes from dielectric matrix 119 by a distance 112. In accordance with some of these teachings, distance 112 is less than the thickness 114 of dielectric matrix 119. In some of these teachings, thickness 114 is in the range from 1 µm to 40 µm. In some of these teachings, thickness 114 is in the range from 2 µm to 20 µm, for example, 5 µm. In some of these teachings, distance 112 is half or less thickness 114. In some of these teachings, distance 112 is one quarter or less thickness 114. In some of these teachings, distance 112 is one tenth or less thickness 114. Keeping distance 112 small minimizes any possibility that an over hanging portion of waveguide 117 will sag in a way that affects alignment with output device 111.

Pedestals 103 are scored with openings 102. The scoring is periodic whereby a critical dimension of the pattern reflected in the upper surface of pedestals 103 is approximately one half the distance 126 between adjacent openings 102. In some of these teachings, distance 126 is in the range from 0.1 µm to 10 µm.

Cavity 105 has dimensions suitable for containing the metal bonding structure 107 that bonds device 109 to substrate 115. In some of these teachings, cavity 105 has a width 108 in the range from 10 µm to 2000 µm. In some of these teachings, cavity 105 has a depth 110 in the range from 0.5 µm to 20 µm. Openings 102 may have depths 128 that are less than the depth 110. In some of these teachings, depths 128 are 75% or less depth 110. Openings 102 have widths 124 that are much less than the width 108 of cavity 105. In some of these teachings, widths 124 are in the range from 0.1 µm to 10 µm. Pedestals 103 have widths 122 suitable for supporting device 109. Pedestals 103 may have additional width to allow some flexibility in positioning device 109 over cavity 105 while portions of device 109 are supported on pedestals 103 to either side of cavity 109. In some of these teachings, pedestals 103 have widths 122 in the range from 5 µm to 2000 µm. In some of these teachings, pedestals 103 have widths 122 in the range from 10 µm to 200 µm, for example 50 µm.

A hard mask 121 may be present over dielectric matrix 119. Hard mask 121 may protect dielectric matrix 119 and devices within dielectric matrix 119 during a process of forming cavity 105 and pedestals 103. Devices formed within dielectric matrix 119 may include waveguide 117. In some of these teachings, waveguide 117 is silicon nitride (SiN). In some of these teachings, a heater operative to change a refractive index within waveguide 117 is formed with dielectric matrix 119. Such a heater may be useful in phase tuning or scanning. Dielectric matrix 119 may also include devices such as an optical deflection device, a diffraction grating, a beam emitter, a phase tuner, an optical phased array, a photodetector, and the like. While MEMS 100 may be any type of MEMS device, in some of these teachings MEMS 100 is a light detection and ranging system (LiDAR) or a time-of-flight (TOF) camera. In some of these teachings, MEMS 100 is a wireless communication device. In some of these teachings, MEMS 100 includes an optical switch. In some of these teachings, MEMS 100 include circuitry for processing data produced by a photodetector.

In some of these teachings, substrate 115 is a bulk silicon substrate. Substrate 115 may also be a binary semiconductor substrate (e.g., GaAs), a tertiary semiconductor substrate (e.g., AlGaAs), a higher order semiconductor substrate, or even a sapphire substrate. In some of these teachings, the substrate 115 is a semiconductor-on-insulator (SOI) substrate (e.g., silicon on insulator substrate).

Device 109 may be any type of device that could be desirable to bond to substrate 115. In some of the teachings, device 109 is a device for which vertical alignment relative to other devices on substrate 115 enhances functionality in MEMs 100. In some of these teachings, device 109 includes a semiconductor substrate. In some of these teachings, device 109 is a laser. In some of these teachings, device 109 is a laser diode.

In some of these teachings, metal bonding structure 107 include one or more of copper (Cu), tin (Sn), gold (Au), indium (In), titanium (Ti), alloys thereof, combinations thereof, or the like. In some of these teaching, metal bonding structure 107 includes two or more of the foregoing. For example, metal bonding structure 107 may include CuSn, AuSn, or AuIn. In some of these teachings, metal bonding structure 107 includes a CuSn—Cu bond, a CuSn—CuSn bond, an AuSn—Au bond, an AuIn—Au bond, or the like. In some of these teachings, metal bonding structure 107 includes one or more materials that have a melting temperature of 300° C. or less. A low melting point enables a lower temperature bonding process.

FIGS. 2-10 provide a series of cross-sectional views 200-1000 that illustrate a MEMS device according to the present disclosure at various stages of manufacture according to a process of the present disclosure. Although FIGS. 2-10 are described in relation to a series of acts, it will be appreciated that the order of the acts may in some cases be altered and that this series of acts are applicable to structures other than the ones illustrated. In some embodiments, some of these acts may be omitted in whole or in part. Furthermore, it will be appreciated that the structures shown in FIGS. 2-10 are not limited to a method of manufacture but rather may stand alone as structures separate from the method.

Figure 2:
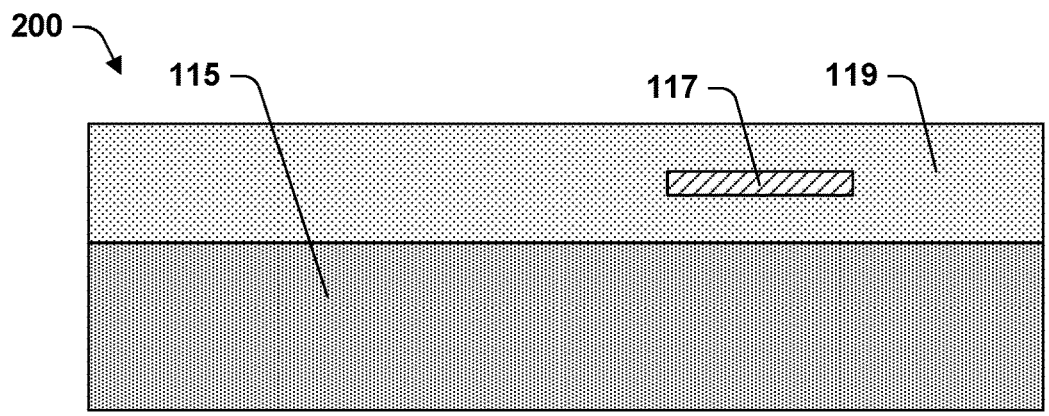
FIGS. 2-10 provide cross-sectional views of a MEMS according to some aspects of the present disclosure undergoing a manufacturing process according to some aspects of the present disclosure.

As illustrated by the cross-sectional view 200 of FIG. 2, a process according to the present disclosure may begin with a substrate 115 over which there has been formed a waveguide 117 or other device within a dielectric matrix 119. In some embodiments substrate 115 is in the form of a wafer at this stage of processing and is not diced until after bonding with device 109. When in the form of a wafer, substrate 115 may have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as a "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

Dielectric matrix 119 may include one or more layers of various dielectrics. In some of these teachings, dielectric matrix 119 includes an oxide such as silicon dioxide. Dielectric matrix 119 may be a low-κ dielectric. As used herein, a low-κ dielectric is a dielectric material with a dielectric constant κ less than about 3.9. Dielectric 108 may be an extremely low-κ dielectric, which may be a low-κ dielectric with porosity that reduces the overall dielectric constant. In addition to or instead of waveguide 117, dielectric matrix 119 may include any number of devices of any suitable type. In some of these teachings, a back-end-of-line (BEOL) metal interconnect structure is found within dielectric matrix 119.

Figure 3:
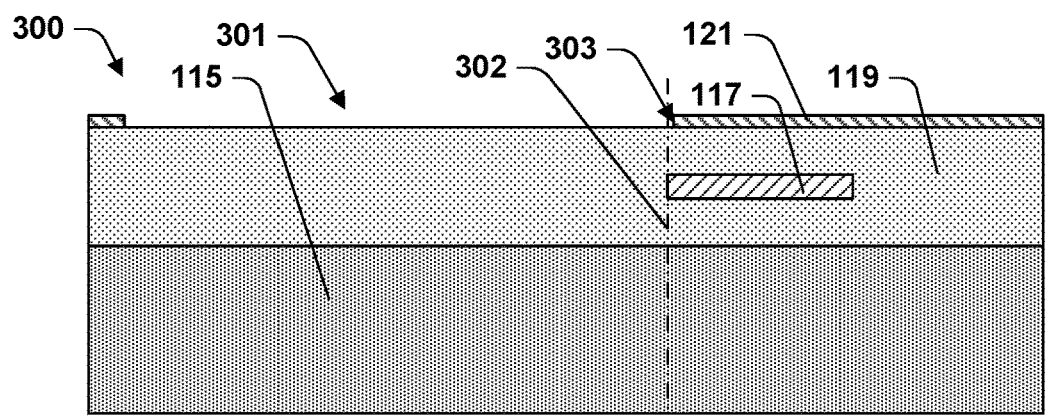

As illustrated by the cross-sectional view 300 of FIG. 3, a hard mask 121 may be formed and patterned over dielectric matrix 119. Hard mask 121 may be formed of any suitable material. A suitable material may be SiN. Hard mask 121 may be patterned by photolithography or any other method to include an opening 301, which defines a device attachment area. Opening 301 may have a width in the range from 100 μm to 10,000 μm. Opening 303 may be positioned to have an edge 303 at or slightly beyond a position 302 that aligns with an outer edge of waveguide 117.

Figure 4:
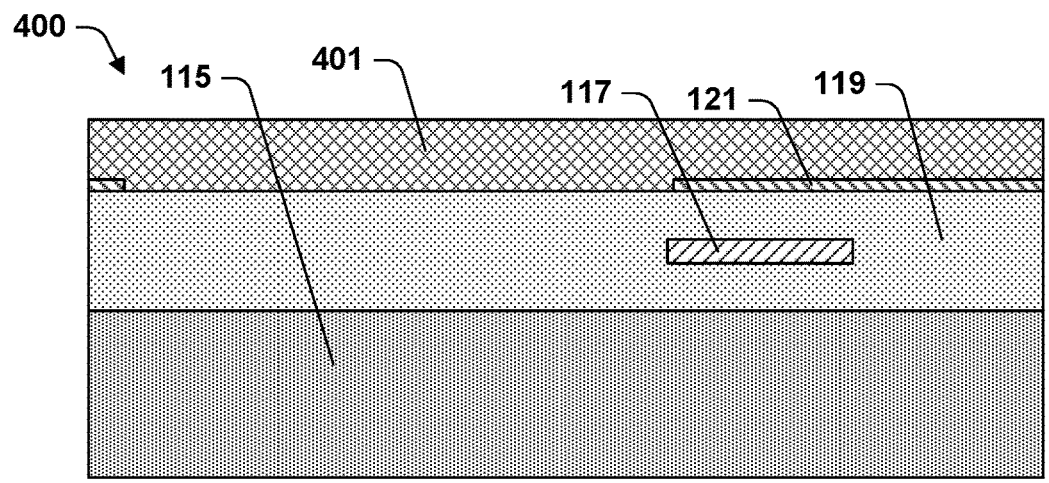

As illustrated by the cross-sectional view 400 of FIG. 4, a mask layer 401 is formed over dielectric matrix 119 and hard mask 121. Mask layer 401 may be a photoresist or another type of mask that may be patterned using a photoresist.

Figure 5:
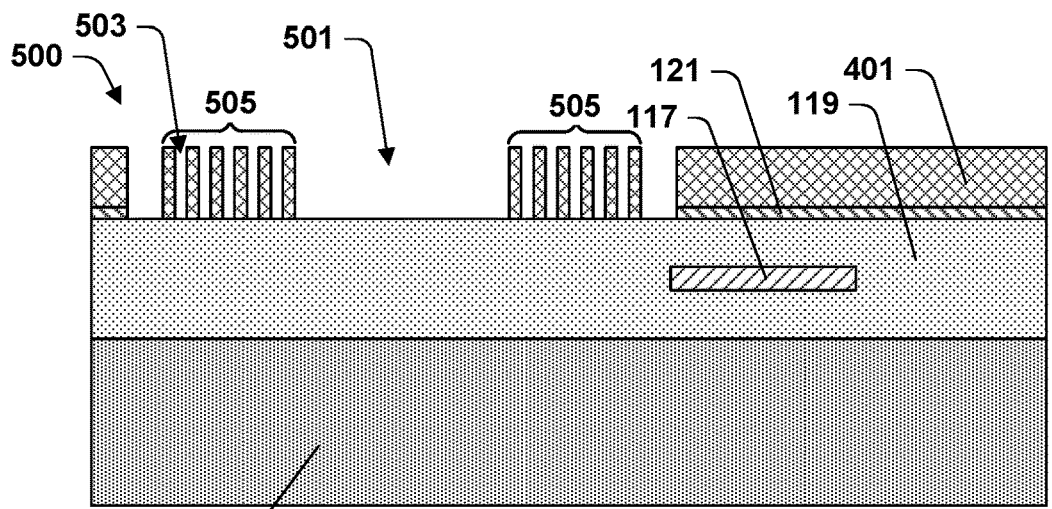

As illustrated by the cross-sectional view 500 of FIG. 5, mask layer 401 is patterned with a cavity opening 501 and segmentation openings 503. Cavity opening 501 has a width in the range from 10 μm to 2000 μm. Segmentation openings 503 are formed in pedestal areas 505 to either side of cavity opening 501. Pedestals areas 505 may have widths in the range from 5 μm to 2000 μm. Segmentation openings 503 may have widths in the range from 0.1 μm to 10 μm. Segmentation openings 503 may be in the form of trenches or other shapes. Segmentation openings 503 may be distributed throughout pedestal areas 505 to pattern mask 401 in pedestal 505 to provide a critical dimension in the range from 0.05 μm to 5 μm.

Figure 6:
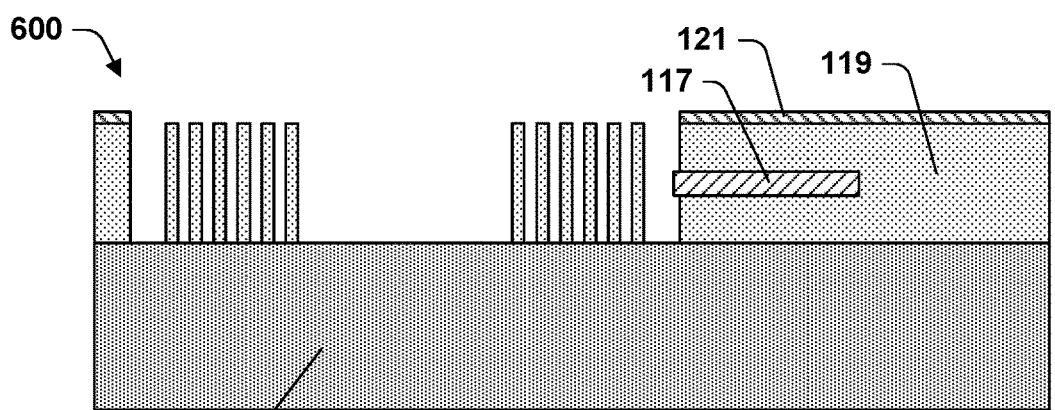

As illustrated by the cross-sectional view 600 of FIG. 6, etching is carried out to transfer the pattern of mask layer 401 into dielectric matrix 119. In some of these teachings, the etch process is an anisotropic etch process. In some of these teachings, the etch process used for this pattern transfer is a dry etch process such as plasma etching. The etch chemistry may be selective for the removal of oxides over nitrides. In some of these teachings, the etch process is a process used for self-aligned contact oxide etching. The etch process may expose an end of waveguide 117. Mask 401 may be stripped after this etch process. Mask 401 may be stripped by ashing or any other suitable process.

Figure 7:
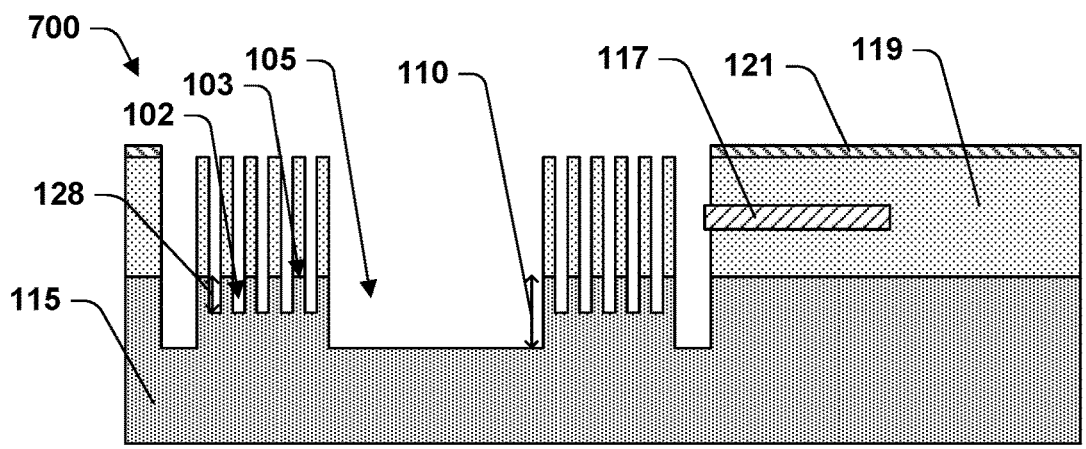

As illustrated by the cross-sectional view 700 of FIG. 7, another etch process is carried out in which dielectric matrix 119 provides a mask for etching substrate 115. In some of these teachings, the etch process for etching substrate 115 is a dry etch process. In some of these teachings, the etch process is an anisotropic etch process. The etch chemistry may be selective for the removal of silicon over oxides and nitrides. This etch process produces cavity 105 in substrate 115 and openings 102 in pedestal areas 103 to the sides of cavity 105. Due to the smaller aspect ratio of the openings in dielectric matrix 119 in pedestal areas 103, openings 102 have depths 128 that are less than a depth 110 of cavity 105. The etch process may include plasma etching using fluorine chemistry. The plasma may be generated with tetrafluoromethane ($CF_4$), fluoroform ($CHF_3$), difluoromethane (e.g., $CH_2F_2$), sulfur hexafluoride ($SF_6$), hexafluoroethane ($C_2F_6$), hexafluoropropylene ($C_3F_6$), octafluorocyclobutane ($C_4F_8$), perfluorocyclopentene ($C_5F_8$), another suitable fluorine compound(s), any combination of the foregoing, or the like. Argon, oxygen, and other suitable gases may also be included in the etch chemistry. In some of these teachings, the etch process is a high-aspect ratio plasma etching process such as the Bosch process. The Bosch process is a cyclic process that includes alternating steps of etching with sulfur hexafluoride ($SF_6$) or the like, which etches substrate 115, and etching with octafluorocyclobutane ($C_4F_8$) or the like, which produces a protective layer on the mask-providing dielectric matrix 119.

Figure 8:
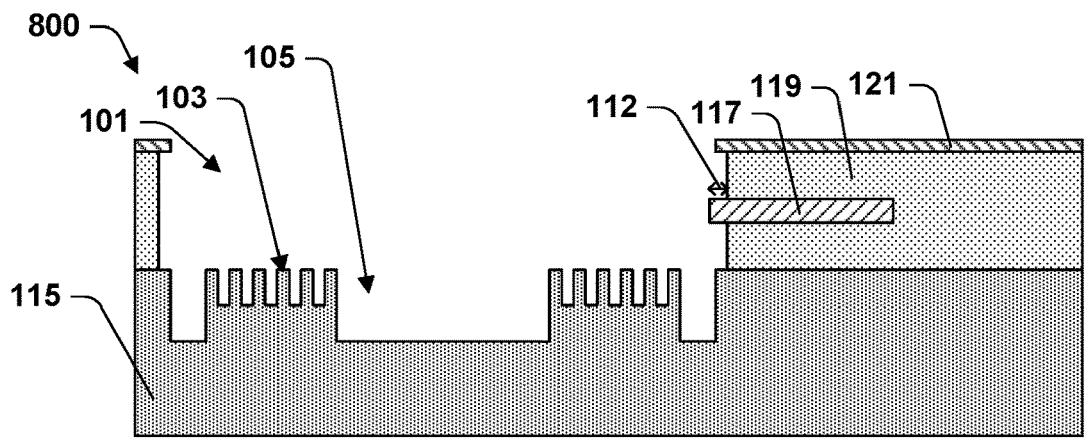

As illustrated by the cross-sectional view 800 of FIG. 8, an etch process is carried out to remove dielectric matrix 119 from the area over pedestals 103. This etch increases the size of opening 101 and the distance 112 by which waveguide 117 overhangs opening 101. The increase in distance 112 may be limited to a critical dimension of the dielectric matrix 119 within opening 101, which may be limited to one half the spacing between openings 102 (see FIG. 7). In some of these teachings, the etch process is an isotropic etch process. In some of these teachings, the etch process is a wet etch. In some of these teachings, the wet etch process include etching with hydrofluoric acid (HF).

Figure 9:
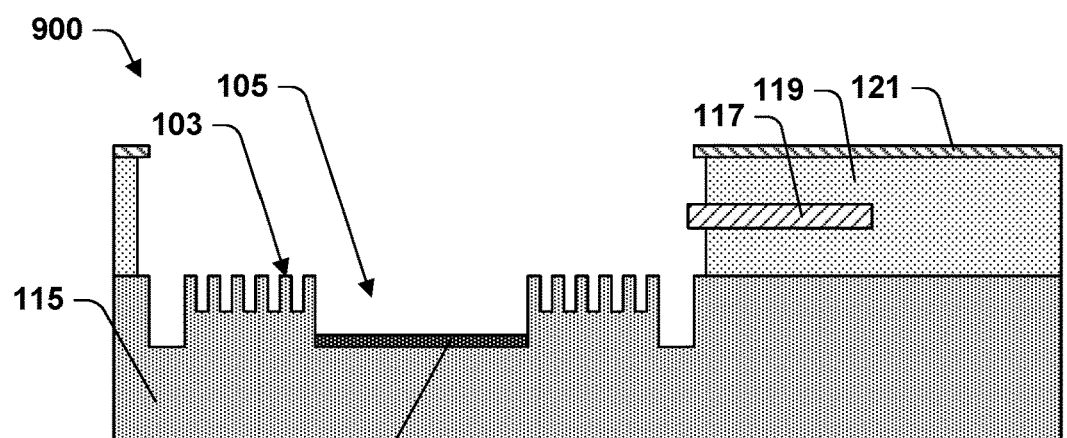

As illustrated by the cross-sectional view 900 of FIG. 9, a bonding process may begin by introducing metal 901 into cavity 105. Metal 901 may be all or a portion of the metal bonding structure 107 used to bind device 109 to substrate 115 (see FIG. 1). In some of these teachings, metal 901 is a seed layer. In some of these teachings, metal 901 is copper (Cu). Depositing metal 901 may include one or more of physical vapor deposition, chemical vapor deposition, electroplating, electroplating, or any other suitable process. Other metals that may be deposited into cavity 105 include, without limitation, tin (Sn), gold (Au), indium (In), titanium (Ti), alloys thereof, and the like.

Figure 10:
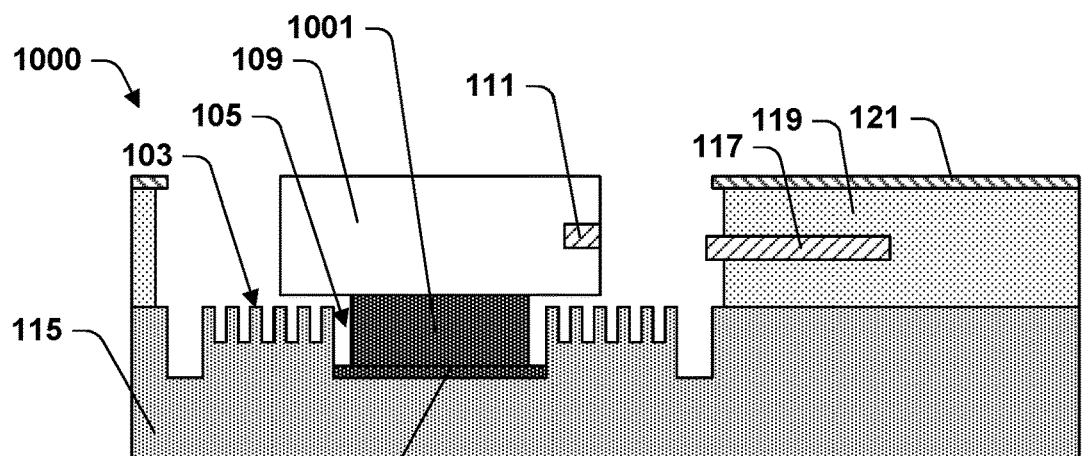

As illustrated by the cross-sectional view 1000 of FIG. 10, device 109 is then placed over cavity 105. In some of these teachings, prior to placing device 109 over cavity 105, a metal bump 1001 is formed on device 109. In some of these teaching, metal bump 1001 fits within cavity 105 and facilitates correct positioning of device 109 on substrate 115. In some of these teachings, metal bump 1001 includes all of the metals forming metal bonding structure 107 (see FIG. 1) other than the metal 901 introduced into cavity 105 prior to placing device 901 over cavity 109. At stage of processing, device 109 may be part of a wafer that will be subsequently diced, a wafer chip, or another device structure. Device 109 may be placed on pedestals 103, but in some of these teachings, metal bump 1001 prevents device 109 from resting on pedestals 103 before the bonding process.

FIG. 1 illustrated the result of applying a bonding process to the structure illustrated by the cross-sectional view 1000 of FIG. 10. The bonding process may cause the metals 901 and 1001 to combine by flowing, mixing, and/or inter-diffusing. As shown in FIG. 1, at the conclusion of the bonding process, device 109 rests against pedestals 103 to provide a desired vertical alignment of device 109. The bonding process may include pressing device 109 against substrate 115. Examples of suitable processes for this bonding include compression bonding, solid-liquid inter-diffusion bonding (SLiD), or the like. The bonding process may include heating. In some of these teaching, heating includes heating above the eutectic point of two metals forming portions of metal bonding structure 107. In some of these teachings, the temperature is limited to remain below the melting point of one of the metals forming the eutectic mixture.

Figure 11:
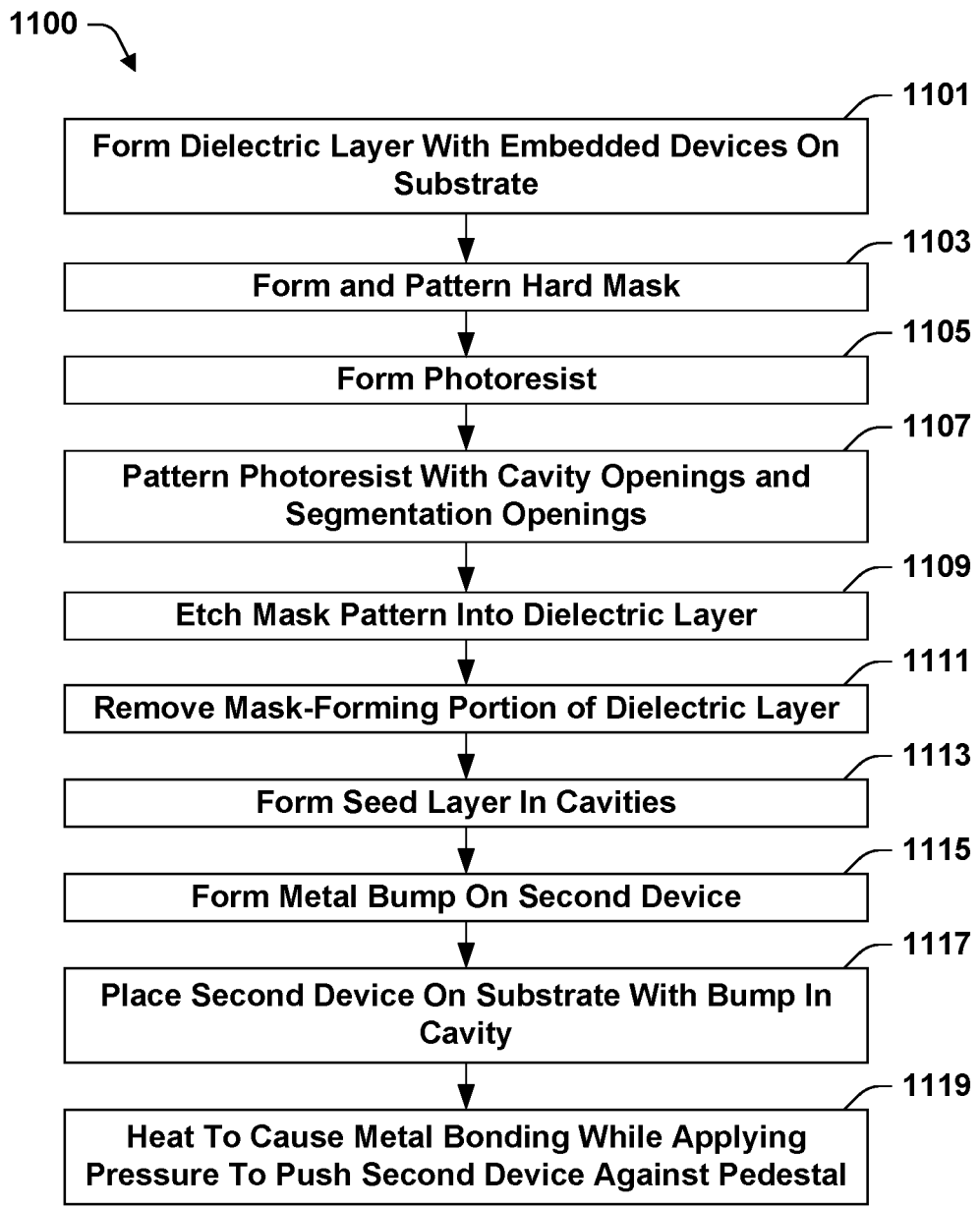
FIG. 11 provides a flow chart for a method of manufacturing a MEMS device according to some aspects of the present disclosure.

FIG. 11 provides a flow chart of a process 1100 according to some aspects of the present disclosure that may be used to produce MEMS devices according to the present disclosure. While process 1100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 1100 begins with act 1101, forming a dielectric layer with embedded devices on a substrate 115 to produce a structure such as the one illustrated by the cross-sectional view 200 of FIG. 2. Act 1101 may include front-end-of-line (FEOL) and BEOL processing. FEOL processing may include doping areas in or on substrate 115 and forming transistors and like devices. BEOL processing may include forming a multilevel metal interconnect structure within dielectric matrix 119. Embedded devices may include a waveguide 117.

Process 1100 continues with act 1103, forming and patterning a hard mask 121 as illustrated by the cross-sectional view 300 of FIG. 3. Hard mask 121 limits the opening 101 in dielectric matrix 119 to an area that is opened for attaching device 109. Hard mask 121 is optional in processes according to the present disclosure. As show in FIGS. 5 and 6, mask 401 may protect areas of dielectric matrix 119 outside opening 101 during segmentation of dielectric matrix 119 over pedestals 103. Segmentation of dielectric matrix 119 over pedestals 103 allows dielectric matrix 119 to be removed with an etch process too short in duration to etch through dielectric matrix 119. With reference to FIGS. 7 and 8, if hard mask 121 were absent, the segmented portion of dielectric matrix 119 could be removed while removing only a thin layer from the top of dielectric matrix 119 elsewhere over substrate 115.

Process 1100 continues with act 1105, forming mask 401 as shown in FIG. 4, and act 1107, patterning mask 401 with an opening 501 for forming cavity 105 and openings 503 for segmenting dielectric matrix 119 over pedestals 103 as shown in FIG. 5. Mask 401 may be a photoresist mask and may be patterned using photolithography or any other method.

Process 1100 continues with act 1107, patterning dielectric matrix 119 using mask 401 as illustrated by the cross-sectional view 600 of FIG. 6. The patterning may be an etch process. The etch process may be an anisotropic dry etching process, for example, an anisotropic plasma etch. This patterning creates an opening in dielectric matrix 119 at the desired location for cavity 105 and may segment dielectric matrix 119 over the desired locations for pedestals 103. Mask 401 may be stripped at the conclusion of this step.

Process 1100 continues with act 1109, etching substrate 115 using dielectric matrix 119 as a mask as illustrated by the cross-sectional view 700 of FIG. 7. The etch process may be an anisotropic dry etching process, for example, an anisotropic plasma etch. This etching creates cavity 105 a scores pedestal areas 103 with openings 102.

Process 1100 continues with act 1109, etching to remove the segmented portion of dielectric matrix 119 from pedestals 103 as illustrated by the cross-sectional view 800 of FIG. 8. The etch process may be an isotropic wet etching process. Previous processing to segment dielectric matrix 11 greatly accelerates this etch process. In some embodiments, this etching process exposes waveguide 117. If waveguide 117 is already exposed, this etching may increase the extent to which waveguide 117 overhangs opening 101. In some of these teachings, this etching is completed in one hour or less.

Process 1100 continues with a series of acts 1113, 1115, 1117, and 1119 by which device 109 is brought to rest on pedestals 103 and is bonded to substrate 115 through metal bonding structure 107 in cavity 105. Various acts in various sequences may serve this same function. In some of these teaching, these acts provide a lock-and-key process in which a portion of the metal bonding structure 107 that is attached to device 109 provide the key and cavity 105 provides the lock. In some of these teachings, a portion of metal bonding structure 107 is introduced into cavity 105 before device 109 is placed over substrate 115. Act 1113 provides an example. Act 1113 is forming a seed layer of metal 901 in cavity 105 as illustrated by the cross-sectional view 900 of FIG. 9. Seed layer 901 may be copper (Cu) or any other metal. Seed layer 901 may be formed by sputtering or any other suitable process. A portion of metal bonding structure 107 may also be provided by a metal bump 1001 formed on device 109 before device 109 is placed over substrate 115. Act 1117 is placing device 109 with metal bump 1001 over substrate 115 as illustrated by the cross-sectional view 1000 of FIG. 10. Between metal bump 1001 and seed layer 901, all the metal bonding structure 107 for bonding device 109 to substrate 115 may be introduced into cavity 105 by the conclusion of act 1117.

Act 1119 is applying heat and pressure to cause metal bump 1001 and seed layer 901 to soften, mix, and diffuse to form metal bonding structure 107 while device 109 is brought to rest on pedestals 103 to produce a result comparable to device 100 illustrated by FIG. 1. In some of these teachings, this bonding process is a low temperature thermocompression bonding process. A low temperature is 300° C. or less. Any suitable process may be used. In some of these teachings, act 119 includes metal diffusion bonding. Metal diffusion bonding may include like metals. Examples include aluminum gold (Au—Au), copper (Cu—Cu), or the like. In some of these teachings, the process used includes eutectic bonding. Eutectic bonding may be between copper and tin (Cu—Sn), gold and tin (Au—Sn), tin and lead (Sn—Pd), or the like. Alloys of these metals and three metal layer structures may also be used. The resulting metal bonding structure 107 may include various layers having various compositions including at least one layer of a eutectic mixture and at least another layer of a pure metal or a mixture ratio other than a eutectic mixture.

Some aspects of the present teachings relate to a system that includes a semiconductor substrate having a first cavity. The semiconductor substrate forms a pedestal adjacent the first cavity. A device overlays the pedestal and is bonded to the semiconductor substrate by metal within the first cavity. A plurality of second cavities are formed in a surface of the pedestal beneath the device, wherein the second cavities are smaller than the first cavity. In some of these teachings, the second cavities are voids. In some of these teachings, the metal in the first cavity comprises a eutectic mixture. The structure relates to a method of manufacturing in which a layer providing a mask to etch the first cavity is segmented to enable easy removal of the mask-providing layer from the area over the pedestal.

Some aspects of the present teachings relate to a microelectromechanical system. The system includes a semiconductor substrate and a device bonded to the semiconductor substrate by a metal bonding structure in a bonding area. The device contacts the semiconductor substrate over a support area adjacent the bonding area. The semiconductor substrate has a pedestal structure in the support area. The first device abuts an upper surface of the pedestal structure that is scored. In some of these teachings, the metal bonding structure is formed within a cavity in the semiconductor structure, the cavity has a width, and the upper surface of the pedestal structure is scored by trenches having widths smaller than the width of the cavity. In some of these teachings, the cavity has a depth and the trenches have depths less than the depth of the cavity.

In some of these teachings, the metal bonding structure is below a height of the upper surface of the pedestal structure. In some of these teachings, the upper surface of the pedestal structure is aligned with a top of the metal bonding structure. In some of these teachings, the metal bonding structure is the product of solid-liquid inter-diffusion bonding. In some of these teachings, a second device is formed in or on the semiconductor substrate and functioning of the microelectromechanical system depends on a vertical alignment between the first device and the and second device. In some of these teachings, a waveguide is formed within a dielectric matrix formed over the semiconductor substrate and the first device is a laser. In some of these teachings, the dielectric layer has a thickness, the waveguide protrudes from the dielectric layer into an opening in the dielectric layer within which the laser is located, and the waveguide protrudes into the opening by a distance that is less than the thickness of the dielectric layer.

Some aspects of the present teachings relate to a method that includes forming a dielectric matrix over a semiconductor substrate. A first device structure is contained within the dielectric matrix. The dielectric matrix is patterned with an opening and a plurality of slits in an area of the dielectric matrix adjacent the opening. The opening is wider than the slits. The semiconductor substrate is etched using the dielectric matrix as a mask to form a cavity beneath the first opening and a pedestal adjacent the first opening, wherein the pedestal is furrowed by trenches resulting from etching through the slits. The dielectric matrix is then removed from the pedestal by etching. A second device is placed on the semiconductor substrate over the cavity and the pedestal and bonded to the semiconductor substrate using metal in the cavity to produce a structure in which the second device abuts the pedestal.

In some of these teachings, the method includes pressing the second device and the semiconductor substrate together during the bonding process at least until the second device abuts the pedestal. In some of these teachings, the slits reduce a critical dimension of the dielectric matrix over the pedestal to less than a thickness of the dielectric matrix. In some of these teachings, the method includes forming a metal bump on the second device and bonding the second device to the semiconductor substrate includes bonding using metal from the metal bump. In some of these teachings, bonding the second device to the semiconductor substrate includes solid-liquid inter-diffusional binding. In some of these teachings, the slits reduce a time for the etching to remove the dielectric matrix from the pedestal to be completed. In some of these teachings, the slits are formed periodically across the dielectric matrix above the pedestal with a spacing less than a thickness of the dielectric matrix. In some of these teachings, the dielectric matrix is an oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a semiconductor substrate having a first cavity;
   a pedestal formed by the semiconductor substrate in an area adjacent the first cavity;
   a device that overlays the pedestal, and is bonded to the semiconductor substrate by metal within the first cavity; and
   a plurality of second cavities formed in a surface of the pedestal beneath the device, wherein the second cavities are smaller than the first cavity.

2. The system of claim 1, wherein the second cavities are voids.

3. The system of claim 1, wherein the metal in the first cavity comprises a eutectic mixture.

4. The system of claim 1, wherein the second cavities are shallower than the first cavity.

5. The system of claim 1, wherein the second cavities are three or more in number and are periodically spaced across the surface.

6. A microelectromechanical system, comprising:
   a semiconductor substrate; and
   a device bonded to the semiconductor substrate by a metal bonding structure in a bonding area;
   wherein
   the semiconductor substrate forms a pedestal structure lateral to the bonding area; and
   the device abuts an upper surface of the pedestal structure that is scored.

7. The microelectromechanical system of claim 6, wherein:
   the metal bonding structure is formed within a cavity in the semiconductor substrate;
   the cavity has a width; and
   the upper surface of the pedestal structure is scored by trenches having widths smaller than the width of the cavity.

8. The microelectromechanical system of claim 7, wherein:
   the cavity has a depth; and
   the trenches have depths less than the depth of the cavity.

9. The microelectromechanical system of claim 6, wherein the metal bonding structure is below a height of the upper surface of the pedestal structure.

10. The microelectromechanical system of claim 6, wherein the metal bonding structure is a product of solid-liquid inter-diffusion bonding.

11. The microelectromechanical system of claim 6, further comprising:
a second device formed in or on the semiconductor substrate; and
wherein the functioning of the microelectromechanical system depends on a vertical alignment between the device and the second device.

12. The microelectromechanical system of claim 6, further comprising:
a waveguide within a dielectric matrix formed over the semiconductor substrate;
wherein the device is a laser.

13. The microelectromechanical system of claim 12, wherein:
the dielectric matrix has a thickness;
the waveguide protrudes from the dielectric matrix into an opening in the dielectric matrix within which the laser is located; and
the waveguide protrudes into the opening by a distance that is less than the thickness of the dielectric matrix.

14. The microelectromechanical system of claim 6, wherein the upper surface of the pedestal structure is aligned with a top of the metal bonding structure.

15. A microelectromechanical system, comprising:
a semiconductor substrate comprising one or more pedestals; and
a device supported by the one or more pedestals;
wherein the device is bonded to the semiconductor substrate by a metal bonding structure lateral to the one or more pedestals and extending below a height of the one or more pedestals; and
the one or more pedestals are scored with three or more periodically spaced and parallel trenches.

16. The microelectromechanical system of claim 15, wherein the trenches have a pattern that extends across the one or more pedestals.

17. The microelectromechanical system of claim 16, wherein:
a cavity formed in the semiconductor substrate contains the metal bonding structure.

18. The microelectromechanical system of claim 17, wherein a depth of the trenches is less than a depth of the cavity.

19. The microelectromechanical system of claim 15, further comprising:
a waveguide in a dielectric matrix;
wherein the waveguide protrudes from the dielectric matrix.

20. The microelectromechanical system of claim 19, wherein the waveguide protrudes toward the device.

* * * * *